United States Patent
Olander

(10) Patent No.: US 6,770,117 B2
(45) Date of Patent: Aug. 3, 2004

(54) ION IMPLANTATION AND WET BENCH SYSTEMS UTILIZING EXHAUST GAS RECIRCULATION

(75) Inventor: W. Karl Olander, Indian Shores, FL (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 10/284,910

(22) Filed: Oct. 31, 2002

(65) Prior Publication Data

US 2004/0083696 A1 May 6, 2004

(51) Int. Cl.[7] .................... B01D 53/04; B01D 29/00; B01D 46/00
(52) U.S. Cl. .............. 95/67; 95/70; 95/90; 95/133; 95/273; 96/55; 96/108; 96/243; 55/338.1; 55/385.2; 55/467
(58) Field of Search .............. 95/63, 67, 70, 95/90, 133, 149, 273; 96/15, 52, 55, 58, 108, 243; 55/338–340, 385.1, 385.2, 385.4, 467

(56) References Cited

U.S. PATENT DOCUMENTS

| | | | | |
|---|---|---|---|---|
| 4,050,368 A | * | 9/1977 | Eakes | 454/57 |
| 5,350,336 A | * | 9/1994 | Chen et al. | 454/187 |
| 5,518,528 A | | 5/1996 | Tom et al. | |
| 5,972,060 A | * | 10/1999 | O'Halloran et al. | 55/385.2 |
| 6,196,050 B1 | * | 3/2001 | Ikeda et al. | 73/23.2 |
| 6,280,507 B1 | * | 8/2001 | Walker | 95/273 |
| 6,328,776 B1 | * | 12/2001 | Shanks et al. | 55/385.2 |
| 6,585,192 B2 | * | 7/2003 | Beers | 244/135 R |
| 2001/0015133 A1 | * | 8/2001 | Sakai et al. | 95/273 |
| 2002/0035921 A1 | * | 3/2002 | Ishihara et al. | 95/45 |
| 2003/0136265 A1 | * | 7/2003 | Holst et al. | 96/108 |
| 2003/0196551 A1 | * | 10/2003 | Dautenhahn | 95/273 |

* cited by examiner

Primary Examiner—Robert H. Spitzer
(74) Attorney, Agent, or Firm—Margaret Chappuis; Steven J. Hultquist

(57) ABSTRACT

Apparatus and method for utilizing recirculated exhaust gas in semiconductor manufacturing system, in a manner substantially reducing the effluent burden on the exhaust treatment system and infrastructure of the semiconductor process facility.

62 Claims, 2 Drawing Sheets

ION IMPLANTATION AND WET BENCH SYSTEMS UTILIZING EXHAUST GAS RECIRCULATION

FIELD OF THE INVENTION

The present invention relates generally to semiconductor manufacturing process systems, e.g., ion implantation and wet bench systems, and more specifically to apparatus and methods for utilizing exhaust gas for recirculation in such systems, in a manner substantially reducing the effluent burden on the exhaust treatment system and infrastructure of the semiconductor process facility.

DESCRIPTION OF THE RELATED ART

In the field of semiconductor manufacturing, a variety of unit operations in the semiconductor plant are exhausted at a high volumetric rate due to the hazardous or toxic character or the chemicals contained or processed therein. In general a house blower is mounted exteriorly, typically on the roof, which pulls air through the interior space of the tool to contain any hazardous materials released in the process zone by leaks in the process piping. This large volume of air is intended to capture and sweep contaminates away and minimize the risk to personnel. This sweep air is typically vented to the atmosphere after passing through some type of final scrubber system.

In the semiconductor manufacturing plant, a number of processes may be conducted in enclosed chambers and generate hazardous "process effluent" streams composed of un-reacted starting materials and by-products which require treatment to abate the deleterious components therein, so that the purified effluent can be discharged to the atmosphere.

Accordingly, the typical semiconductor processing facility produces process exhaust that is characteristically contaminated with feed and product/byproduct contaminants, as well as sweep exhausts that typically have only a low level of contaminants therein.

It has been common practice in the semiconductor industry to subject semiconductor "process effluents" to a wide variety of treatments, including point of use combustion and incineration, wet and dry scrubbing, liquid-liquid extraction, chemical complexation, distillative purification, cryoplating of contaminants, etc.

With regard to specific effluent-producing processes, the semiconductor manufacturing unit operation of ion implantation is particularly problematic in respect of producing high volume, low contaminant effluents. Such effluents are large in volume, and the species requiring abatement therein are relatively low in concentration. This confluence of factors requires that significant capital and operating expenses be devoted to effluent and air-handling systems in the semiconductor manufacturing facility, as well as abatement equipment specific for the removal of the low-level contaminants of the effluent stream.

The cause of the high sweep exhaust requirement for ion implantation is twofold. The implantation process draws considerable energy from the numerous vacuum pumps employed, high temperature operation, the ion acceleration and separation equipment and the considerable electronics packages and power supplies create a large thermal heat load which must be removed. Today this heat is removed by sweeping large volumes of air through the interior space of the tool.

The ion precursor materials are typically gases and these are stored in a gas box inside the implanter. Standards mandate that the gas box be exhausted at a rate to dilute a worst case release to a concentration equal to ¼ of the OSHA prescribed personal exposure level in the work space.

In ion implantation, a dopant species, such as Sb, In, B, As, P, etc., typically supplied by a source reagent, is contacted with an ion beam generator or ionizer to generate an icon beam. The resulting ion beam then is passed to a mass analyzer unit that selects the desired ions and rejects the non-selected ions.

The selected ions pass through an acceleration electrode array and deflection electrodes. A resultantly focused ion beam is impinged on a substrate element disposed on a rotatable holder mounted on a spindle in the ion implantation unit. The ion beam is used to dope the substrate as desired, to form a doped material for fabrication of the product microelectronic device structure.

Accordingly, a process effluent is produced from the ion implant chamber that is composed of various ionic fragments, reconstituted compounds, reaction byproducts, and included outgassed species from the ion implant chamber walls, in-leaking atmospheric gases which arc highly contaminated and in general only suited to be purified and vented. On a volumetric basis, this process effluent stream comprises about 1% of the total exhaust from the tool.

In sum, high exhaust gas flows have conventionally been encountered in the ion implantation field, where such high exhaust gas flows serve to dilute any toxic release emanating from a pump, piping or coupling malfunction as well as to remove latent heat from the large concentration of electrical equipment and pumps. As a consequence, conventional ion implanters are being exhausted at a flow rate of 2000 cubic feet per minute (CFM), in conventional practice. This high volumetric flow rate means that the exhaust-handling system must be oversized relative to the actual amount of hazardous material present in the effluent, and that larger capacity fans and blowers, etc. are required to accommodate the high flows, as well as larger and more expensive effluent treatment equipment. In addition replacement air must be re-supplied back to the manufacturing area. Typically this make-up air must be filtered, humidity adjusted and controlled to a set temperature.

A similar deficiency is present in wet bench systems commonly used in semiconductor manufacturing facilities. In the fabrication of semiconductor wafers, a multitude of aqueous cleaning steps are required to remove impurities from the surface of the wafer prior to subsequent processing. Generally, a batch of wafers is immersed into one or more chemical tanks (termed "wet benches") that contain chemicals that are needed for clean or etch functions.

Containment of hazardous chemicals in semiconductor wet processing systems is done today using below-deck exhaust systems, which function to capture chemical fumes or keep them at or below the deck. In order to effectively keep hazardous chemicals under control and out of the workspace above the deck, the below-deck exhaust systems have to effectuate flow of large volumes of filtered air through the wet cleaning tools at very high rates, e.g., on the order of 150 cubic feet per minute (cfm) per linear foot of the tool. High capacity exhaust systems are expensive, energy-consuming, and costly to install and maintain.

In wet benches it is typical to sweep large volumes of air through the mechanical areas of the bench (the area that contains the circulation pumps, chemical dispense and mixing). This is pre-cautionary and done largely to insure that small liquid leaks don't lead to accumulations of hazardous and or corrosive materials in this area.

It therefore is apparent that there exist semiconductor processing operations that rely on bulk flows of "carrier" or "sweep" gas and that in consequence entail severe disadvantages in respect of capital and operating expenses in the semiconductor manufacturing facility. It would correspondingly be a significant advance in the semiconductor art to at least partially overcome such deficiencies of such prior art bulk gas flow processes.

SUMMARY

The present invention relates to a system and process for reducing infrastructural requirements and operating costs of the aforementioned bulk gas flow processes.

In one aspect, the present invention relates to a gas recirculating system for use in a process facility generating a low-level contamination in a local gaseous environment in said process facility, said gas recirculating system comprising local gas flow circuitry having coupled thereto a chemical filter including a material having chemisorptive affinity for the low-level contamination, wherein the local gas flow circuitry is arranged and constructed for coupling to the local gaseous environment and flow of gas from the local gaseous environment through the chemical filter for removal of low-level contamination therefrom and recirculation thereof to the process facility.

In another aspect, the invention relates to a process for reducing exhaust gas load on a house exhaust system in a process facility generating a low-level contamination in a local gaseous environment in said process facility, said process comprising providing a local gas flow circuitry having coupled thereto a chemical filter including a material having chemisorptive affinity for the low-level contamination, flowing gas including low-level contaminants from the local gaseous environment through the local flow circuitry and chemical filter for removal of low-level contamination from said gas, and recirculating gas purified of said low level contaminants from the local flow circuitry to the process facility.

Other aspects, features and advantages of the invention will be more fully apparent from the ensuing disclosure and appended claims.

DETAILED DESCRIPTION OF THE INVENTION AND PREFERRED EMBODIMENTS THEREOF

Figure 1:
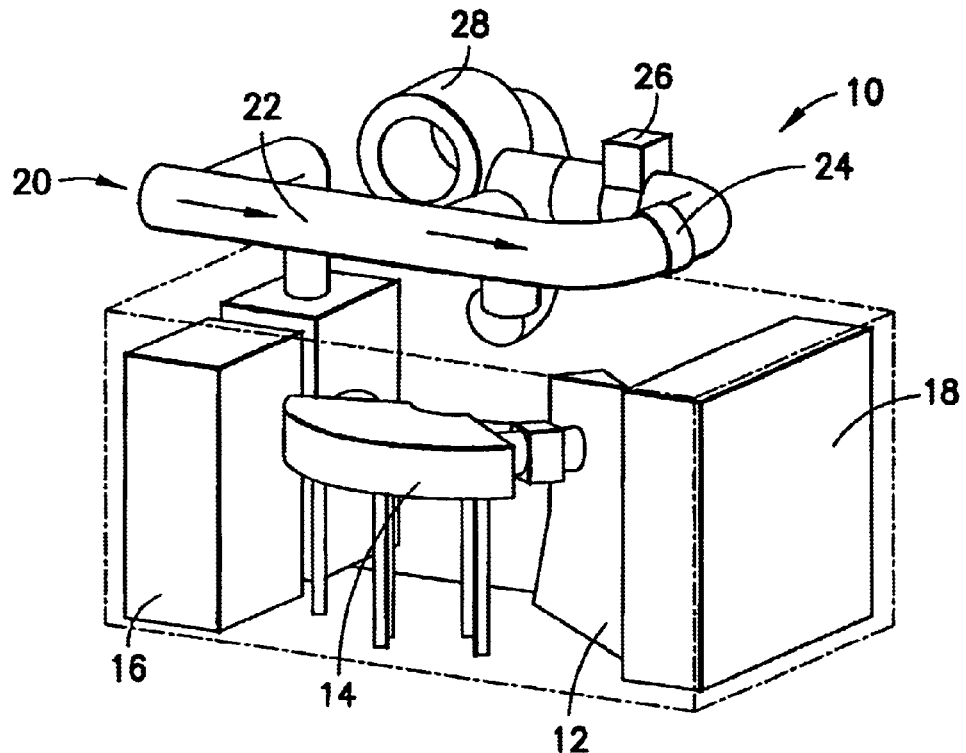
FIG. 1 is a perspective rear view.

The present invention is based on the discovery that the bulk exhaust requirements of semiconductor processes such as ion implant and wet bench chemical processing of wafers may be substantially improved by the use of partial to total exhaust recirculation in connection with the use of ancillary equipment whose incremental cost is extremely favorable to overall economics of semiconductor plant operation, relative to current standard practice.

The gas recirculation process of the present invention in application to ion implantation operations represents a radical approach of decoupling the implanter unit from the "house" exhaust system of the semiconductor facility and utilizing a local recirculation system that operates with much reduced flows in relation to such house systems.

The prevailing sense and practice of the semiconductor industry has been that high capacity effluent abatement systems afford economies of scale and simplify the task of effluent treatment in relation to a facility that typically employs many different types of unit operations—e.g., chemical vapor deposition, photoresist ashing and wet stripping, reactive ion etching, sputtering formation of films, and sublimation-based boule growth, to name but a few—all of which produce different effluents that must be treated. House exhaust systems in many semiconductor manufacturing plants constitute overdesigned roof-mounted installations, often with volumetric bulk gas flow rates of 100,000 CFM or more in the ducting and flow channels of such exhaust systems. As stated earlier, the replacement of this air is also expensive.

The present invention in application to ion implantation systems, in accordance with a preferred aspect of the invention, utilizes low pressure dopant gas sources of a type as described in Tom et al., U.S. Pat. No. 5,518,528, to reduce gas box exhaust flows in ion implantation systems to levels on the order of 50–100 CFM. The disclosure of Tom et al., U.S. Pat. No. 5,518,528 is hereby incorporated herein by reference in its entirety.

The use of the ion implant dopant gas sources of such type may be further augmented with an arrangement for isolating the dopant gas source if a predetermined threshold pressure is not achieved, as an additional method of increasing the safety of the ion implant installation and reducing the gas box exhaust level.

The Tom et al. dopant gas source utilizes a fluid storage and dispensing vessel containing a physical sorbent medium having sorptive affinity for the dopant source gas, which is arranged with a dispensing assembly that is selectively actuatable to effect desorption of gas and dispensing thereof from the vessel. Since the dopant source gas in such vessel is held at sub-atmospheric pressure, the gas is intrinsically much safer to use, since the dangers of valve head leakage and rupture of compressed gas cylinders is absent.

Accordingly, a physical sorbent-based gas storage and dispensing system can be employed for ion implantion at low pressure, with the provision of isolative flow circuitry, e.g., a valved manifold with pressure transducer sensors monitoring the gas flow in the manifold, and actuatable to isolate the physical sorbent-based gas storage and dispensing system if the monitored pressure goes above 760 torr (and keep the system at sub-atmospheric pressure relative to the gas box). Gas monitors and auxiliary power supplies may be employed in such isolation safety system.

Such physical sorbent-based gas storage and dispensing system is intrinsically safe, since the subatmospheric pressure condition of the contained gas will prevent its accidental release from the vessel other than by diffusion, an inherently slow process in comparison to bulk release of gas that accompanies leak or rupture of a conventional compressed gas cylinder.

The other reason (other than to purge accidental bulk release of compressed gas in conventional pressurized gas supply systems for ion implant) for exhaust from the ion implanter at high rates is to remove latent heat. The ion implantation system arrangement of the present invention utilizes an apparatus arrangement that can reduce the exhaust flow rate from the ion implant chamber by a factor of about 10 times or more, and includes the following apparatus components: (1) a physical sorbent-based gas storage and dispensing source of the dopant gas for the ion implantation process; (2) overpressure controls, (3) gas monitors/interlocks, and (4) gas recirculation flow circuitry coupled with a (i) chemisorption filter and (ii) heat exchanger, joined in gas flow communication with the ion implant chamber.

In operation, air is drawn from the gas box of the ion implantation chamber, optionally with augmentation of such gas stream with air from other sources, flowed into a flow passage, e.g., a unitary plenum, chemically filtered by contact with the chemisorbent so that any toxic gas components of the ion implant effluent are removed to residual levels in the effluent stream that is below threshold limit value (TLV) of such components. The chemically filtered gas then is cooled, e.g., air-cooled, filtered and returned to the ion implant unit.

The chemical filter in such aspect of the invention is suitably sized for extended service life, to minimize downtime and maintenance events.

In application to an average semiconductor fabrication facility, the apparatus and method of the present invention effects significant operating cost savings, e.g., $15–18K per ion implanter per year for such average "fab." As applied to new semiconductor facility installation of ion implantation systems, the apparatus and method of the invention achieve substantial capital equipment costs by avoiding the necessity of connecting the ion implant chamber exhaust to the conventional roof system, the latter of which can run $100,000 to 200,000 per implanter.

The system of the invention can be employed with a local blower, as opposed to the large blower units, etc. that are employed in connection with conventional roof-mounted exhaust systems, and the "run" or length of ducting, piping etc. with the apparatus of the present invention enables a substantial reduction in electricity requirements and costs, since a local blower draws substantially less electricity than roof-mounted systems with long runs of piping and ducting.

The apparatus and method of the invention, as illustratively described in application to ion implant systems, may likewise be applied to other semiconductor tool usages where low levels of toxic gas components are present and the probability of a gas release is small.

The local blower utilized in the flow circuitry associated with the apparatus and method of the invention may be of any suitable type. In a preferred embodiment of the invention, the blower is a dual speed blower or a multispeed blower, whereby the blower may operate at a first speed during normal operation, and at a higher rate during change out of gas supply vessels, or other maintenance or routine quality assurance activities, such as purging of the manifolds, etc.

The invention thereby contemplates a flow circuitry in which air can be recirculated in the operation of the ion implantation system. A small bleed or blow-down capability can be provided in such enclosed flow circuitry to maintain a required or desired turn-over of air in the operation of the system.

Appropriately located toxic gas sensors are located in the system to warn of hazardous materials entering the internal volume of the implanter, possibly from piping breaches or pump coupling failures.

The invention in another aspect relates to a wet bench apparatus including a flow circuitry coupled with a chemical filter, and optionally a physical filter, and a motive driver such as the aforementioned blower, or alternatively a fan, compressor, turbine, ejector, eductor, pump, etc., in which the flow circuitry is coupled for flow interchange with the environment of the wet bench.

The invention is highly advantageous in application to wet bench systems, since about 40–50% of the air from wet benches has a very low level of contamination. This is the air flushing the mechanical areas, such as below decks, where the chemicals are mixed, pumped, analyzed and circulated, or even air pulled from above the bench that has very low contamination, such as a few vapors pulled to the top when wafers are added or removed from the bath.

The remaining air associated with the bath is exhausted by the plenum box; see, for example, U.S. Pat. No. 6,280,507, the disclosure of which hereby is incorporated herein by reference in its entirety. Air pulled from around the chemical tanks (plenum box) can have 50–500 ppm of contaminants. Such air is not purified in the manner of the present invention, but is vented to the roof, or else an air manager system may be employed when the relative level of contaminant concentration is small, and such remaining air can be cleaned and reused.

The flow circuitry of the invention can be employed to feed exhaust to the front of a wet bench to the intake of a filter fan unit (FFU) so that the air is used more directly than in conventional practice.

Thus, in enclosed systems, recirculating air in accordance with the invention is chemically cleaned, filtered, and returned to the filter fan unit intake. In such manner, the air is refiltered and fed back into the wet station enclosure. The station desirably is nominally run under a slight negative pressure.

In application to open architecture wet bench systems, the cleaned air is returned to the fab and recirculated. In such manner, the air is recleaned, tempered, and adjusted in humidity.

It will therefore be appreciated that the present invention affords a major improvement in circumstances where subatmospheric pressure gas supply is employable to mitigate the risk and dangers attendant to large volume releases of gas.

Further, in situations in which air purging is employed for sweeping of gas from an environment producing low-level contamination of the ambient atmosphere, the invention enables the low-level contamination to be segregated in a gas recirculation flow circuit and flowed therein through a chemical filter to chemisorbingly remove the low-level contaminants from the gas, optionally with physical filtration as desired or necessary, and to reuse the air in the environment.

Particularly in environments where heat is generated incident to the occurrence of the low-level contamination, the gas recirculation scheme of the present invention permits the dissipation of the local environmental heat, with the recirculating gas serving to cool the equipment and pumps, and other apparatus and structure in such local environment. The invention therefore will be appreciated as having broad utilty in addition to the illustrative semiconductor processing operations forming a preferred implentation of the invention. In semiconductor manufacturing operations, the total energy consumption of a fab is typically split 60–40 between operation of the facility (air, heating/cooling, exhaust, etc.) and energy consumed by the process equipment. Exhaust capability is a significant component of cost of semiconductor facilities. It is estimated that the costs of exhaust installation is on the order of $100/CFM at the time of construction. Sematech published the cost per CFM at $9.50/CFM/yr., meaning that a conventional ion implanter facility running at 2000 CFM costs almost $19,000/year in energy expenditure.

As used herein, the term "low level contamination" means a concentration of a toxic or hazardous fluid species that is less than about 50 ppmv, or a concentration not exceeding the TLV of the contaminant considered, whichever is greater.

The features and advantages of the invention are more fully shown with reference to the following illustrative embodiments.

Figure 2:
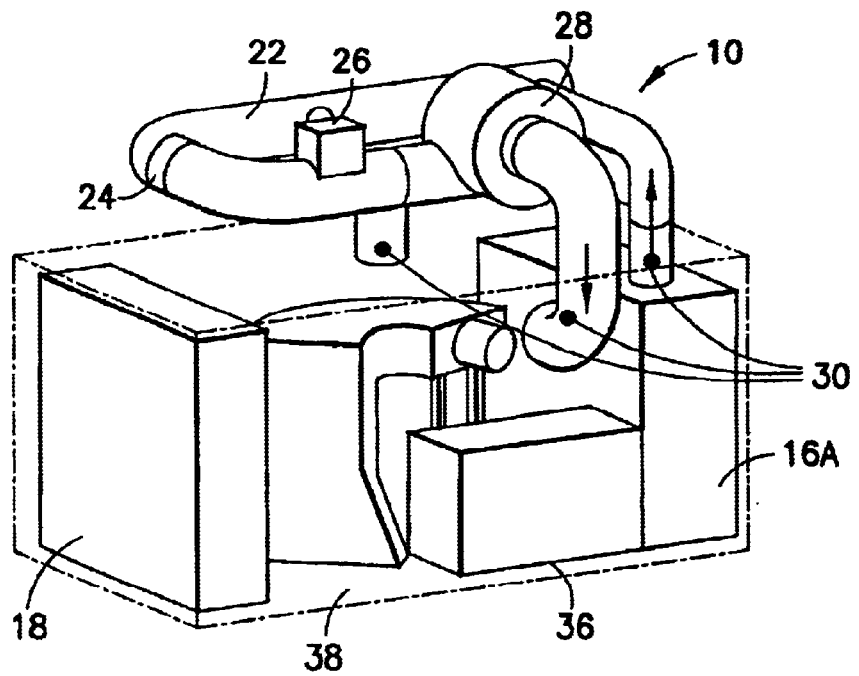
FIG. 2 a perspective front view of a recirculating exhaust system according to one embodiment of the invention.

FIG. 1 is a perspective rear view and FIG. 2 a perspective front view of a recirculating exhaust system 10 according to one embodiment of the invention.

The system 10 is associated with an ion implanter enclosure 38 including the ion implant process chamber 12 and beam launch 14, as shown in FIGS. 1 and 2, with a control cabinet 16 and a gas cabinet 16A. A vacuum pump 36 is adjacent to the implant process chamber as illustrated. An end station, stocker and mini-environment 18 completes the basic installation as illustrated.

The recirculating exhaust system 10 includes flow circuitry 20 comprising an exhaust plenum 22 and exhaust blower 28 recirculating the exhaust gas to the gas box (enclosure 38) or to the exterior environment of the semiconductor manufacturing facility.

In the flow circuitry 20 is a chemical adsorption filter 24 including an in-line cannister or bed of sorbent that is chemisorbingly reactive with contaminant species in the gas flowed through the flow circuitry. The flow circuitry is also coupled with heat exchanger 26 for thermal conditioning, e.g., heat recovery or cooling of the exhaust gas, flowed through the flow circuitry. FIG. 2 also shows the locations of gas monitoring points 30 for gas monitoring in the recirculating exhaust system 10.

By the arrangement shown in FIGS. 1 and 2, it is possible to avoid flow of the exhaust gas from the ion implant system's gas box to the house exhaust system of the semiconductor manufacturing facility. Additionally, the contaminants in the exhaust gas from the gas box are chemically sorbed in the flow circuitry of the exhaust system so that the gas is thereafter safe for breathing exposure in the manufacturing facility.

Figure 3:
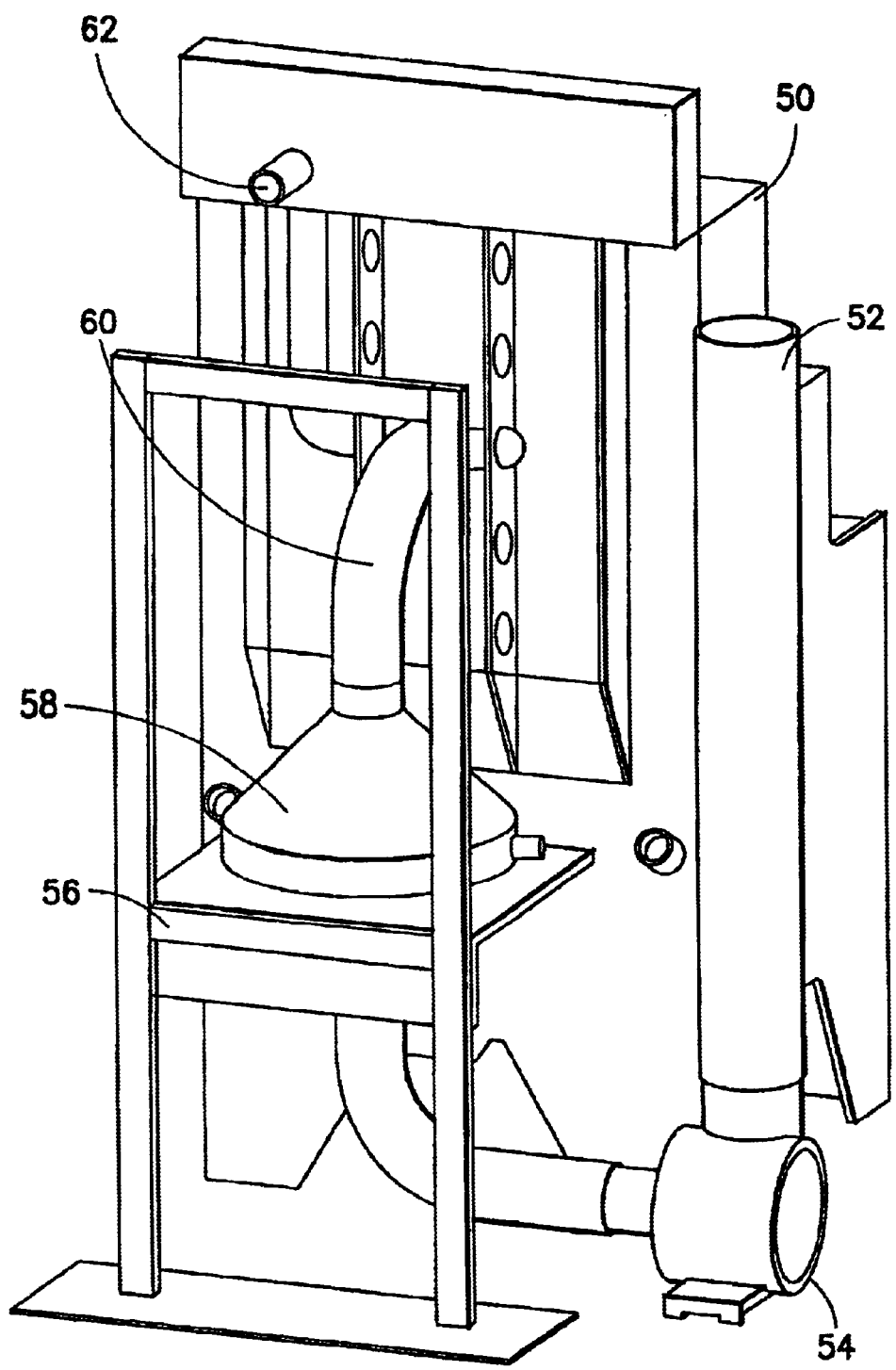
FIG. 3 is a perspective rear view of a wet bench configured in accordance with another embodiment of the invention.

FIG. 3 is a perspective rear view of a wet bench 50 configured in accordance with another embodiment of the invention.

The wet bench 50 includes a process tank exhaust 62 associated with an air manager system (AMS). Gas including fumes from the chemical tank is flowed by the exhaust 62 to the house exhaust system.

The wet bench exhaust gas, containing little or no low level contaminants, is flowed in the wet bench exhaust 60 to the chemisorption/particle filter unit 58 wherein any contaminants are chemisorbed by suitable sorbent medium having chemisorptive affinity therefor, and particles are removed by mechanical filter, electrostatic collector, or other suitable means. The chemisorption/particle filter unit 58 is supported on the frame structure 56 as illustrated, and the flow circuitry is coupled with blower 54 to discharge the treated gas to the exhaust area 52.

The present invention as illustratively described with reference to the foregoing exemplary embodiments therefore permits a substantial reduction of capital and operating costs to be achieved, in a manner that is easily implemented and operated in the semiconductor manufacturing facility.

What is claimed is:

1. A process for reducing exhaust gas load on a house exhaust system in a process facility generating a low-level contamination in a local gaseous environment in said process facility, said process comprising providing a local gas flow circuitry having coupled thereto a chemical filter including a material having chemisorptive affinity for the low-level contamination, flowing gas including low-level contaminants from the local gaseous environment through the local flow circuitry and chemical filter for removal of low-level contamination from said gas, and recirculating gas purified of said low level contaminants from the local flow circuitry to the process facility.

2. The process of claim 1, wherein the process facility comprises a semiconductor manufacturing plant.

3. The process of claim 2, wherein the local gaseous environment comprises a wet bench unit.

4. The process of claim 3, wherein the gas is flowed from the local gas flow circuitry into the environs of the wet bench unit.

5. The process of claim 4, wherein the gas is flowed from the local gas flow circuitry to the front of the wet bench unit.

6. The process of claim 3, wherein the wet bench unit comprises an open architecture wet bench unit.

7. The process of claim 3, wherein the wet bench unit comprises a filter fan unit with an intake, and gas is flowed from the local gas flow circuitry to said intake.

8. The process of claim 1, wherein the local gaseous environment comprises an ion implant gas box.

9. The process of claim 8, wherein the gas is flowed from the local gas flow circuitry into the gas box.

10. The process of claim 9, further comprising cooling the gas prior to flow thereof from the local gas flow circuitry into the gas box.

11. The process of claim 10, wherein said cooling comprises air cooling.

12. The process of claim 11, further comprising filtering particles from the gas after said air cooling.

13. The process of claim 12, wherein said filtering particles comprises flowing the gas through a filter unit selected from the group consisting of mechanical particle filters and electrostatic particle collectors.

14. The process of claim 10, wherein said cooling comprises recovery of heat from the gas.

15. The process of claim 1, wherein the process facility comprises an ion implantation unit.

16. The process of claim 15, wherein the ion implantation unit utilizes a sub-atmospheric pressure dopant gas source.

17. The process of claim 16, wherein the dopant gas source comprises a source reagent for a dopant species selected from the group consisting of Sb, In, B, As, and P.

18. The process of claim 16, wherein the local gas flow circuitry comprises an isolation flow circuitry including pressure sensors therein, wherein the isolation flow circuitry is arranged and constructed to isolate the sub-atmospheric pressure dopant gas source if pressure sensed by the pressure sensors is greater than 760 torr.

19. The process of claim 18, wherein the isolation flow circuitry comprises a valved manifold with said pressure sensors therein.

20. The process of claim 1, wherein said local gas flow circuitry has coupled thereto a motive driver for flowing gas therethrough.

21. The process of claim 20, wherein the motive driver comprises a blower.

22. The process of claim 21, wherein the blower comprises a dual speed blower.

23. The process of claim 21, wherein the blower comprises a multi-speed blower.

24. The process of claim 20, wherein the motive driver comprises a driver unit selected from the group consisting of blowers, fans, compressors, turbines, ejectors, eductors, and pumps.

25. The process of claim 20, wherein the motive driver is constructed and arranged for flowing gas through the local gas flow circuit at flow rate in a range of from 50 to 100 cubic feet per minute.

26. The process of claim 1, wherein the gas comprises air.

27. The process of claim 1, further comprising sensing presence of toxic gas in the local gas flow circuitry.

28. The process of claim 1, further comprising physically filtering gas flowed through the local gas flow circuitry.

29. The process of claim 1, wherein the chemical filter is constructed and arranged to reduce toxic or hazardous gas components to concentration below TLV level thereof.

30. The process of claim 1, wherein the chemical filter comprises a filter unit selected from the group consisting of in-line chemical filter canisters and chemical filter sorbent beds.

31. A method of thermally managing an ion implantation facility including an enclosure containing an implantation process chamber and an ion implantation gas source, said method comprising coupling local gas flow-circuitry with the enclosure, wherein the local gas flow circuitry has coupled thereto a chemical filter including a material having chemisorbtive affinity for low-level contamination, and a heat exchanger constructed and arranged to cool gas flowed through the local gas flow circuitry.

32. An ion implantation facility including an enclosure containing an implantation process chamber and an ion implantation gas source, and local gas flow circuitry coupled with the enclosure for flow of gas from the enclosure through the local gas flow circuitry and return to the enclosure, wherein the local gas flow circuitry is coupled with a chemical filter including material having chemisorbtive affinity for low-level contamination, and a heat exchanger for cooling gas flowed through the local gas flow circuitry.

33. A gas recirculating system for use in a process facility generating a low-level contamination in a local gaseous environment in said process facility, said gas recirculating system comprising local gas flow circuitry having coupled thereto a chemical filter including a material having chemisorptive affinity for the low-level contamination, wherein the local gas flow circuitry is arranged and constructed for coupling to the local gaseous environment and flow of gas from the local gaseous environment through the chemical filter for removal of low-level contamination therefrom and recirculation thereof to the process facility.

34. The system of claim 33, wherein the process facility comprises a semiconductor manufacturing plant.

35. The system of claim 34, wherein the local gaseous environment comprises an ion implant gas box.

36. The system of claim 35, wherein the gas is flowed from the local gas flow circuitry into the gas box.

37. The system of claim 36, wherein the local gas flow circuitry is coupled to a heat exchanger arranged to cool said gas prior to flow thereof from the local gas flow circuitry into the gas box.

38. The system of claim 37, wherein the heat exchanger comprises an air cooling heat exchanger.

39. The system of claim 38, wherein the local gas flow circuitry has a particle filter coupled thereto.

40. The system of claim 39, wherein the particle filter comprises a filter unit selected from the group consisting of mechanical filters and electrostatic collectors.

41. The system of claim 37, wherein the heat exchanger is arranged for recovery of heat from the gas.

42. The system of claim 34, wherein the local gaseous environment comprises a wet bench unit.

43. The system of claim 42, wherein the gas is flowed from the local gas flow circuitry into the environs of the wet bench unit.

44. The system of claim 43, wherein the gas is flowed from the local gas flow circuitry to the front of the wet bench unit.

45. The system of claim 42, wherein the wet bench unit comprises an open architecture wet bench unit.

46. The system of claim 42, wherein the wet bench unit comprises a filter fan unit with an intake, and gas is flowed from the local gas flow circuitry to said intake.

47. The system of claim 33, wherein the process facility comprises an ion implantation unit.

48. The system of claim 47, wherein the ion implantation unit includes a sub-atmospheric pressure dopant gas source.

49. The system of claim 48, wherein the sub-atmospheric pressure dopant gas source comprises a source reagent for a dopant species selected from the group consisting of Sb, In, B, As, and P.

50. The system of claim 48, wherein the local gas flow circuitry comprises isolation flow circuitry including pressure sensors therein and the isolation flow circuitry is arranged to isolate the sub-atmospheric pressure dopant gas source if pressure as sensed by the pressure sensors is greater than 760 torr.

51. The system of claim 50, wherein the isolation flow circuitry comprises a valved manifold with said pressure sensors therein.

52. The system of claim 33, wherein the local gas flow circuitry has coupled thereto a motive driver for flowing gas therethrough.

53. The system of claim 52, wherein the motive driver comprises a blower.

54. The system of claim 53, wherein the blower comprises a dual speed blower.

55. The system of claim 53, wherein the blower comprises a multispeed blower.

56. The system of claim 52, wherein the motive driver comprises an apparatus selected from the group consisting of blowers, fans, compressors, turbines, ejectors, eductors and pumps.

57. The system of claim 52, wherein the motive driver is arranged for flowing gas through the local gas flow circuitry at flow rate in a range of from 50 to 100 cubic feet per minute.

58. The system of claim 33, wherein the gas comprises air.

59. The system of claim 33, further comprising toxic gas sensors in the local gas flow circuitry.

60. The system of claim 33, wherein the local gas flow circuitry further has coupled thereto a physical filter.

61. The system of claim 33, wherein the chemical filter is arranged and constructed to reduce concentration of toxic or hazardous species in the gas to concentration below TLV level.

62. The system of claim 33, wherein the chemical filter comprises a filter unit selected from the group consisting of in-line canister chemical filters and chemical filter sorbent beds.

* * * * *